United States Patent [19]

Thepault

[11] Patent Number: 5,107,587
[45] Date of Patent: Apr. 28, 1992

[54] METHOD FOR THE CONSTRUCTION AND APPLICATION OF A CIRCUIT-BOARD INTERFACE FOR ELECTRICAL CONNECTION IN CONTROL AND MONITORING APPARATUS

[75] Inventor: Claude Thepault, Milan, Italy

[73] Assignee: Crouzet S.p.A., Baranzate Di Bollate, Italy

[21] Appl. No.: 477,251

[22] Filed: Feb. 7, 1990

[30] Foreign Application Priority Data

Feb. 9, 1989 [IT] Italy ................. 19368 A/89

[51] Int. Cl.$^5$ ............................................. H01R 9/06
[52] U.S. Cl. ........................................ 29/843; 29/839; 228/56.3; 228/173.1; 228/180.2; 439/74; 439/75
[58] Field of Search .............. 228/56.3, 180.2, 173.1; 29/839, 843, 840, 830; 439/74, 75

[56] References Cited

U.S. PATENT DOCUMENTS

| | | | |
|---|---|---|---|
| 3,184,830 | 5/1965 | Lane et al. | 29/843 |
| 3,808,680 | 5/1974 | Lafrate et al. | 29/843 |
| 4,663,815 | 5/1987 | Hartman et al. | 29/839 |
| 4,884,335 | 12/1989 | McCoy et al. | 29/839 |

FOREIGN PATENT DOCUMENTS 133747 1/1979 Fed. Rep. of Germany ........ 29/839

OTHER PUBLICATIONS

IBM Tech Discl Bull vol. 29, No. 1B Jun. 1981 pp. 859-860 by Phelps et al.

*Primary Examiner*—Carl J. Arbes
*Attorney, Agent, or Firm*—Herbert Dubno

[57] ABSTRACT

A method for the construction and application of a plate interface for the electrical interconnection in control and monitoring devices with terminal outlets of the plate type, using the steps of:

making a rigid printed circuit having apertures disposed according to the layout of the output terminals of the control device;

applying by screen-printing a soldering paste onto the locations of the printed circuit corresponding to the terminals to be brought into electrical contact;

preheating only the terminals of the control device;

assembling the electrical interconnection plate on the control device with the interposition of a further plate for the thermal protection of the control device itself; and melting of the soldering paste according to a thermal cycle comprising an associated programming and monitoring device having output terminals for connectors of the plate-type, electrically interconnected and functionally arranged by means of an interface having a rigid plate electrically connected to the terminals by welding, intended especially for use in washing machines, drying machines and the like.

5 Claims, 2 Drawing Sheets

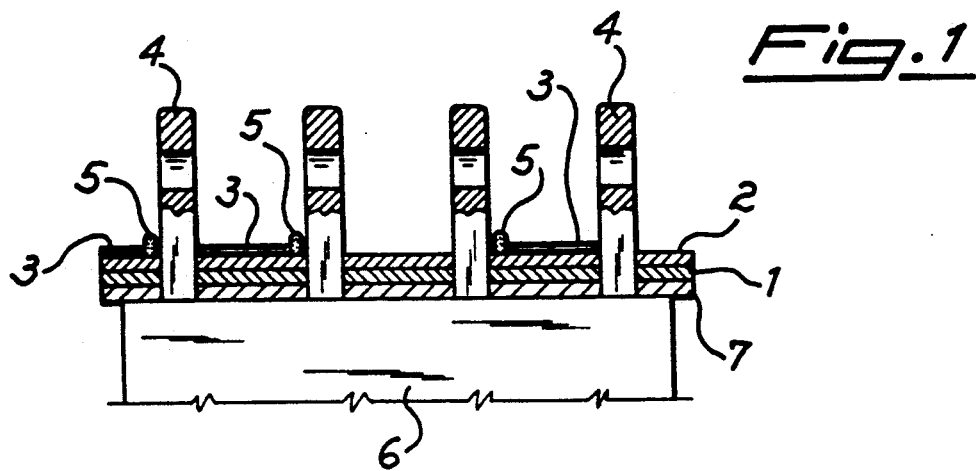
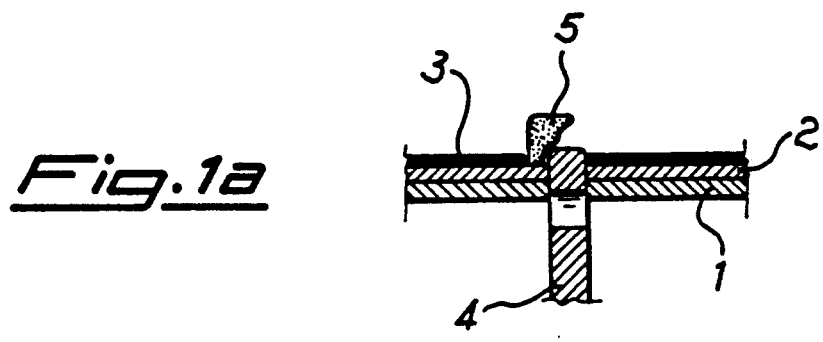
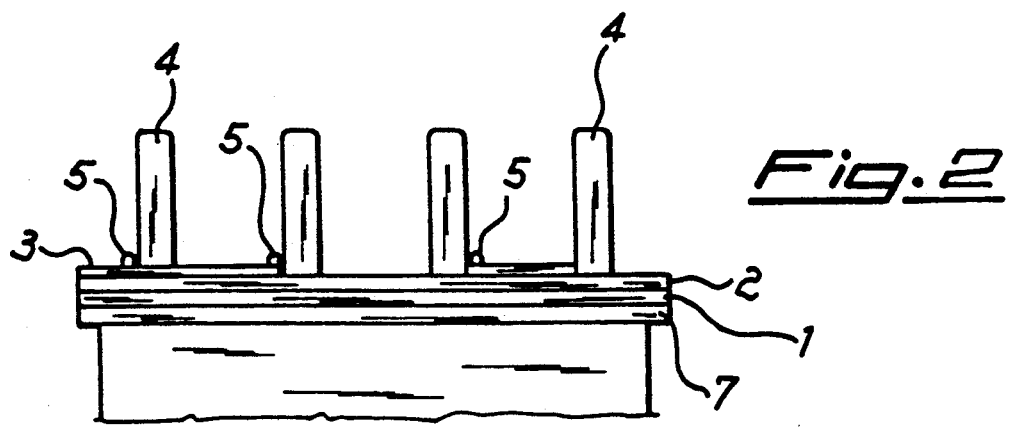

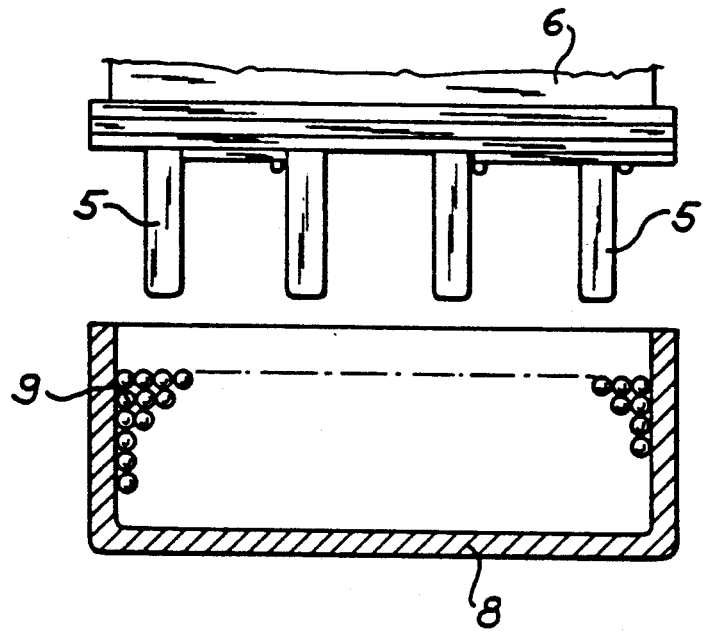
_Fig.3a_
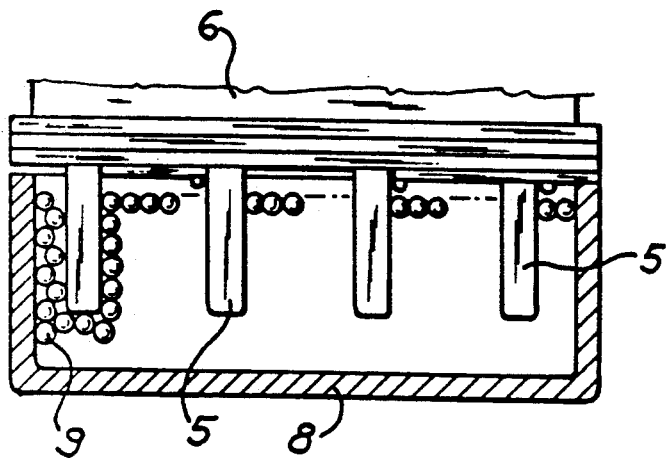
_Fig.3b_
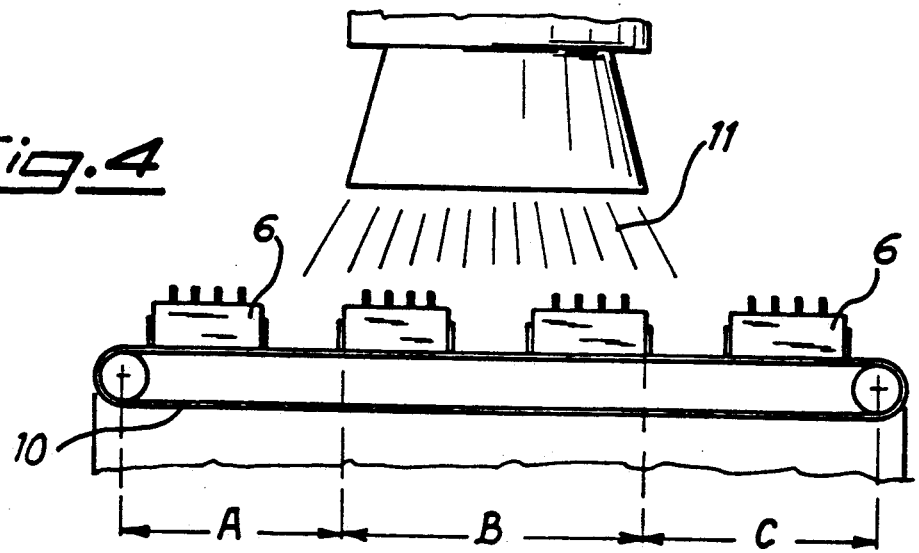
_Fig.4_

METHOD FOR THE CONSTRUCTION AND APPLICATION OF A CIRCUIT-BOARD INTERFACE FOR ELECTRICAL CONNECTION IN CONTROL AND MONITORING APPARATUS

FIELD OF THE INVENTION

The present invention is a plate interface for making electrical connection and the associated method of construction and use, especially for controlling and monitoring washing machines and the like, having electrical output terminals for connectors of the plate-type or the like.

It is known that control of cycle sequences in washing machines and the like is achieved by an electromechanical and/or electronic programmer, to which are led all the power and control cables of the various electrically operated components, such as: motors, pumps, resistance heaters and the like. Normally all the aforementioned cables are connected to the programmer by various types of connectors individually and without a precise logical order of connection. Electrical outputs of the programmer is linked to its internal structure and not to any final use arrangement diagram. Consequently there results a large number of external cables with their attendant high risk of mistakes and breakages, as well as large bulk and high cost of construction. Additional problems arise from the conducting outputs of the programmer which are composed of terminals, for example of the plate type. These terminals must be used for power connections and must provide suitable mechanical strength for the effects of the connectors. Terminal size and weight is required to be considerably greater than the electrical connection circuits which are normally formed by printed circuit boards. Direct soldering is therefore rendered difficult between conductor paths of the printed circuit and terminals by known methods. One such method is wave soldering which can cause damage or prevent the correct fitting of the connector to the terminal, as a result of the deposit of soldering material on the surface of the terminal.

A further problem is presented by the presence of plastics materials, which constitute the base of the control device and which do not allow, because they have a low softening and melting point, the direct application to the terminal plates of the high temperatures required for the soldering.

In an attempt to overcome these disadvantages, some types of interface have been produced, such as for example that described in the Italian Patent application 19.807 A/87 in the name of the present applicant (see U.S. Pat. No. 4,895,524) in which the interface connects onto outwardly projecting pin-type terminals having small dimensions and suitable for soldering, Terminals of the plate type are formed on a surface opposite that of the pin-type terminals. This arrangement is not ideal with regard to the internal cabling of the various contact points, the sizes, weight and costs of production and the connection by soldering together of very unbalanced masses.

OBJECT OF THE INVENTION

The object of the present invention is to obviate these disadvantages in a plate interface for electrical connection, especially for attachment to control and monitoring apparatus in washing machines and the like. A method for construction of a plate interface is sought which achieves an extremely compact device that reduces to the minimum the number of external cables necessary and arranges the connection terminals in a manner ordered according to use. At the same time there is sought the best orientation possible of the outputs in the direction of the final user equipment. The method is also intended to provide a simple construction and suitable for fixing by soldering with automatic machines, thereby reducing the errors of assembly and the production costs.

SUMMARY OF THE INVENTION

The object is achieved by the process for the construction and application of a plate interface for electrical connection and functional layout in control and monitoring apparatuses having plate-type or similar connection terminals, which comprises the steps of:
  constructing of a rigid printed circuit-board with aperture disposed according to the layout of the output terminals of the control device;
  application by screen-printing of a soldering paste onto the locations of the printed circuit corresponding to the terminal plates to be brought into electrical contact;
  only the terminal plates of the control device; assembling of the electrical interconnection plate on the control device with the interposition of a further plate for the thermal protection of the control device itself; and
  melting of the soldering paste in accordance with a thermal cycle comprising a preheating phase, a melting phase and a succeeding slow cooling.

According to the process, the preheating only of the terminals only of the control device is achieved by means of immersion of these terminals in a mass of heated microspheres. Contact with the heated microspheres allows the desired temperature to be reached. Furthermore the perimeter of the one or the other or both of electrical interconnection plate and the thermal protection plate should have dimensions larger than the perimeter of the control device, in order to give to the latter further thermal protection.

It is also provided that the melting of the soldering paste should be carried out in the furnace by means of a directional jet of hot air having a substantially conical diffusion. Control devices assembled with the interface should have their sides thermally protected when they are conveyed beneath the air jet for the purpose of melting.

According to the present invention, there is also provided a programming and control device. The device comprises output terminals exclusively for connectors of the plate type. These terminals are electrically interconnected and functionally arranged by means of a rigid plate interface. The electrical connection is through soldering of the terminals. The interface is composed of a rigid plate of the printed circuit type and of a lower, electrically neutral plate for the thermal protection of the control device. Rigid and neutral plates are formed in such a manner that their dimensions are greater than the corresponding side dimensions of the control device and that their edges project around the entire perimeter, beyond the edges of the device.

The programming and control device with output terminals for connection of the plate type, soldered to a plate interface for the electrical interconnection and the functional arrangement according to this invention is intended especially for use in washing machines and/or drying machines of the industrial or domestic type.

BRIEF DESCRIPTION OF THE DRAWING

There will now be described an example of application of the process and of the associated control and programming device, assembled with the interface device according to this invention, with reference to the accompanying drawing in which:

FIG. 1: a section through a rigid printed circuit board, on which are indicated the soldering locations and the correctly deposited soldering paste;

FIG. 1a: a detail of a location, with incorrect application of the paste;

FIG. 2: a partial schematic view of the programmer with the interface device assembled, but not yet soldered;

FIGS. 3a and 3b are simplified sectional views of the device for preheating the terminal plates of the programmer; and FIG. 4: a simplified elevational view of the soldering furnace.

SPECIFIC DESCRIPTION

The process according to this invention provides that the plate interface device for the electrical interconnection of terminals should be constructed by means of a printed circuit board 1 of the rigid conventional type on which are printed the electrical conductor paths 2 of copper, the whole being covered by a suitable protective material 3 for protection against soldering; on the board 1 there are also formed the apertures disposed according to the layout of the terminals, for entry of the terminal plates 4 of the programmer 6.

The anti-soldering protective material 3 covers the entirety of the printed circuit, leaving exposed only areas in proximity to the apertures, in which the terminal plates 4 are seated. These exposed areas are to be soldered to the conductor paths 2.

In a succeeding phase, the soldering paste 5 is applied by screening printing onto the exposed areas, the quantity of paste being dispensed to the screen printer in amounts in accordance with the conductivity required. It is important to emphasize that the deposition of the paste must be carried out without going beyond the ideal line constituted of the edge of the openings. In fact, where a paste deposit is displaced into the opening, as illustrated in FIG. 1a, the impact caused by the terminal plates 4 against the paste 5 during its entry into the opening causes the paste to be broken or carried away, thereby leading to inadequate soldering in the subsequent operations.

In a further phase (FIGS. 3a and 3b) it is provided that the terminal plates 4 of the programmer 6 are preheated by immersion in a vessel 8, containing heated microspheres 9. In this way is achieved a rapid and accurate heating of the terminal plates of the programmer.

Once the preheating has been carried out, it is necessary rapidly to assemble the electrical interconnection board 1 on the programmer 6, inserting between them a further thermal mask 7, as illustrated in FIG. 2 in such a way that the peripheral dimensions of least one of the board or mask shall be greater than the corresponding peripheral dimensions of the programmer 6. Thereby is produced a projecting edge which further improves the thermal protection of the programmer during the succeeding soldering phase.

In a succeeding phase, the programmer, assembled in this manner, is conveyed into a furnace for the soldering operation itself.

In this furnace, the programmer is guided by a conveyor belt 10 (FIG. 4), constructed in such a manner as to grip the sides of the programmer 6 and to assure not only the holding but also the thermal protection at the plastic part of the programmer.

The belt 10 runs beneath an air jet 11 of substantially conical divergence (FIG. 4), which enables three ideal bands of different temperature to be obtained, and consequently enables the programmer to be subjecting to a thermal cycle comprising the phases of preheating (A in FIG. 4), melting (B in FIG. 4) and slow cooling (C in FIG. 4), to prevent the creation of cold soldered joints.

During the melting phase, the preheating carried out on the plate 4 only of the programmer 6 facilitates the movement of the liquefied soldering paste 5 towards the terminal plate 4 thereby assuring, once the paste has cooled, the correct electrical contact.

The control device with plate interface combination constructed by the method described above is therefore constituted of a programmer device of the electromechanical and/or electronic type, the electrical output terminals of which are all of the plate type or the like. An electrically neutral plate element is applied over the programmer for the thermal protection of the programmer itself and a further plate of the printed circuit type for forming the electrical interconnections, the electrical contact being effected by direct soldering between paths of the printed circuit and output terminals of the programmer.

It will be clear that numerous variants can be applied both to the method and to the device, without thereby departing from the scope of the present invention. It is possible, for example, to create the thermal protection and the electrical interconnection by means of a single plate comprising two layers, of which the lower one is electrically neutral and the upper one is of the printed circuit type.

It is furthermore clear that the output terminals of the control device for electrical connection can be of any type suitable for connection by means of connectors.

I claim:

1. A method for the construction and application of a plate interface for the electrical interconnection in control and monitoring devices with terminal connections of the plate-type which comprises the steps of:
   constructing a rigid printed circuit board with apertures disposed according to a layout of output terminals of a control device;
   applying by screen printing a soldering paste onto locations of the printed circuit board corresponding to the terminals to be brought into electrical contact;
   preheating the terminals only of the control device;
   assembling an electrical interconnection plate formed by said board on the control device with the interposition of a further plate for the thermal protection of the control device itself; and
   melting of a soldering paste in accordance with a thermal cycle comprising a preheating phase, a melting phase and a succeeding slow cooling phase.

2. The method according to claim 1, wherein said preheating of the terminals only of said control device is achieved by immersion of these terminals in a mass of heated microspheres, in contact with which the desired temperature is achieved.

3. The method according to claim 1 wherein a periphery of at least one of said electrical interconnection plate and said thermal protection plate has greater dimensions that the periphery of the control device, in order to give further thermal protection to the latter.

4. The method according to claim 1, wherein the melting of the soldering paste is carried out in a furnace by means of directional jet of hot air and/or inert gas having a substantially conical divergence with its axis perpendicular to the plane of the interface.

5. The method according to claim 1 wherein a plurality of said control devices assembled with the interface have their sides thermally protected while they are conveyed beneath the air jet for the melting phase.

* * * * *